United States Patent [19]

Webb

[11] Patent Number: 5,447,600
[45] Date of Patent: Sep. 5, 1995

[54] POLYMERIC COATINGS FOR MICROMECHANICAL DEVICES

[75] Inventor: Douglas A. Webb, Allen, Tex.

[73] Assignee: Texas Instruments, Dallas, Tex.

[21] Appl. No.: 216,194

[22] Filed: Mar. 21, 1994

[51] Int. Cl.⁶ .................. B44C 1/22; B29C 37/00; C23F 1/00
[52] U.S. Cl. ........................................ 216/2; 216/49; 216/58; 216/83; 73/488; 359/295; 437/228; 437/927
[58] Field of Search ............ 156/643, 655, 656, 659.1, 156/668, 901, 902; 359/291, 295; 437/64, 228, 927; 73/488, 496

[56] References Cited

U.S. PATENT DOCUMENTS 4,172,757 10/1979 Thornburg ................ 156/656 X
4,293,377 10/1981 Miyajima .................. 156/659.1 X
5,216,537 6/1993 Hornbeck .................. 437/64 X
5,298,114 3/1994 Takeshita .................. 156/643

Primary Examiner—William Powell
Attorney, Agent, or Firm—Julie L. Reed; Richard L. Donaldson; Rene E. Grossman

[57] ABSTRACT

A method for reducing sticking between contacting elements in a micromechanical device is disclosed. In addition, a micromechanical device is disclosed wherein the elements of the device are less likely to stick. The method for reducing sticking in a micromechanical device (10) comprises forming a protective layer (26) on a first contact element (14) to reduce the likelihood of a first contacting element (14) sticking to another contacting element (20). The protective layer (26) may be formed of a fluoro-polymer such as Teflon-AF.

20 Claims, 2 Drawing Sheets

POLYMERIC COATINGS FOR MICROMECHANICAL DEVICES

TECHNICAL FIELD OF THE INVENTION

This invention relates generally to micromechanical devices and more particularly a method for applying polymeric coatings to selected surfaces in a micromechanical device and to micromechanical devices with polymeric coatings.

BACKGROUND OF THE INVENTION

Micromechanical devices such as micromotors, microgears and deformable mirror devices often have moveable surfaces that contact one another, either constantly or intermittently. For example, a micromechanical deformable mirror device (DMD) typically contains an address electrode, a landing electrode, one or more support posts, and a deflectable beam. DMDs are primarily used in optical systems where the deflectable beam has a mirrored surface. DMDs, however, may be used in other applications such as accelerometers and the deflectable beam need not have a mirrored surface.

In the case of a DMD, a voltage is applied between the deflectable beam and the address electrode, causing an electrostatic attraction between the address electrode and the deflectable beam. This attraction causes the deflectable beam to deflect towards the address electrode until it contacts the landing electrode. When the charge is removed, the deflectable beam returns to its undeflected position.

Contact between elements in micromechanical devices may result in sticking. For example, in a DMD, the deflectable beam may stick in the deflected position after coming into contact with the landing electrode. Depending upon the duration of the sticking, this can cause a device malfunction. The frequent contacts between the deflectable beam and the landing electrode also tend to wear away the surface of the landing electrode thus decreasing the lifetime of the device.

SUMMARY OF THE INVENTION

One aspect of the invention is a method for reducing sticking of contacting elements of a micromechanical device. To decrease the likelihood of sticking, a protective layer is formed on a first contacting element using a polymeric coating to form a coated element. The protective layer reduces the likelihood that the coated element will stick to another contacting element. This protective layer gets formed during the fabrication of the micromechanical device. For example, in a DMD, one can apply a polymer coating to the landing electrode to prevent the deflectable beam from sticking to the landing electrode when the deflectable beam is deflected.

The protective layer can be formed using standard integrated circuit deposition techniques. The layer to be coated with the protective layer is either deposed or formed. The polymer may then be deposited either before or after etching of that surface.

The invention has many important technical advantages. The polymeric coating maintains thermal stability in the temperature range commonly demanded by military applications. One can apply the polymeric coating using standard semiconductor fabrication techniques thereby allowing easy control over the locations at which the coating is formed. The use of standard fabrication techniques also allows control over the thickness of the polymeric coating. The coating provides a durable layer over the landing electrode, thus increasing the life of the device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
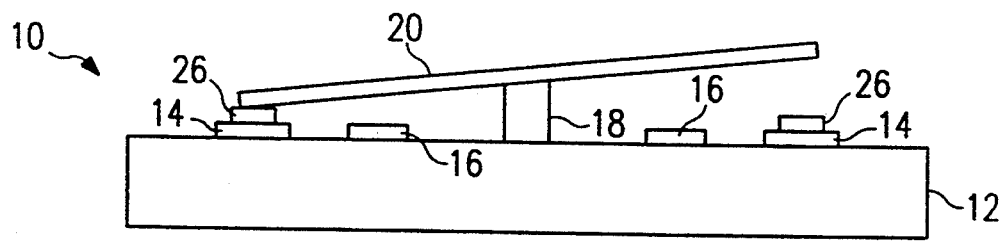
FIG. 1 illustrates an example of a micromechanical device having a protective layer in accordance with the teachings of the present invention.

The preferred embodiment of the present invention and its advantages are best understood by referring to FIGS. 1–3, like numerals being used for like and corresponding parts of the various drawings.

FIG. 1 illustrates a micromechanical device, indicated generally at 10, and known as a deformable mirror device (DMD). DMD 10 consists of semiconductor substrate 12, one or more landing electrodes 14, one or more address electrodes 16, one or more support posts 18, deflectable beam 20, and protective layer 26. Semiconductor substrate 12 contains address and control circuitry for DMD 10 that has been formed using techniques known to those skilled in the art. One or more landing electrodes 14 and one or more address electrodes 16 couple to semiconductor substrate 12. One or more support posts 18 support deflectable beam 20 and suspend deflectable beam 20 over the landing electrodes 14 and address electrodes 16. The surface of landing electrodes 14 is protected by protective layer 26.

In FIG. 1, DMD 10 is shown in its deflected position. In operation, a voltage is applied between deflectable beam 20 and one of the address electrodes 16. This voltage normally causes deflectable beam 20 to deflect towards that address electrode 16 and contact the immediately adjacent landing electrode 14. When the voltage is removed, the deflectable beam returns to its undeflected position.

The present invention reduces the likelihood of sticking in a micromechanical device with contacting elements. Specifically, the invention reduces the likelihood that a first contacting element of a micromechanical device will stick to other contacting elements of the device when those surfaces come in contact with one another. To prevent sticking, one aspect of the invention is forming a polymeric coating on one of the surfaces of the device to prevent sticking. For example, as indicated in FIG. 1, the landing electrodes 14 of DMD 10 have a polymeric coating forming protective layer 26. Protective layer 26 prevents deflectable beam 20 from sticking to landing electrodes 14. Although the present invention can be used to prevent sticking in a DMD 10, it may also be used to prevent sticking in any micromechanical device that is manufacture using integrated circuit fabrication techniques.

The family of fluoro-polymers is an example of a family of polymers that can be used for this purpose. An example of an acceptable fluoro-polymer is a co-polymer of perfluoro (2,2-dimethyl-1,3-dioxole) and tetrafluoroethylene. This polymer is available from DuPont and is also known by the name Teflon-AF.

FIGS. 2A-D and 3A-C illustrate two different methods of applying a polymeric coating to a surface in a micromechanical device. FIGS. 2A-D and 3A-C also show how to construct a DMD 10 employing such a protective coating. These FIGUREs thus illustrate specific embodiments of the invention.

Figure 2A:
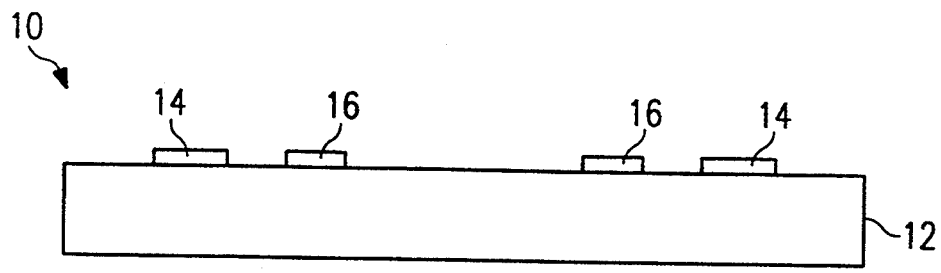
FIGS. 2a–2d illustrate one method of fabricating a micromechanical device in accordance with the invention.

FIGS. 2A-2D illustrate one method of forming a polymeric coating on a surface in a micromechanical device. The first step in fabricating DMD 10 is forming address and control circuitry on semiconductor substrate 12. Next, address electrodes 16 and landing electrodes 14 are formed on semiconductor substrate 12. FIG. 2A illustrates semiconductor substrate 12 with landing electrodes 14 and address electrode 16 already formed. Semiconductor substrate 12 also includes address and control circuitry (not shown). The method of forming the structures illustrated in FIG. 2A is known in the art. These structures could be fabricated, for example, using the teachings of U.S. Pat. No. 4,956,619, entitled "Spatial Light Modulator" and assigned to Texas Instruments Incorporated.

Figure 2B:
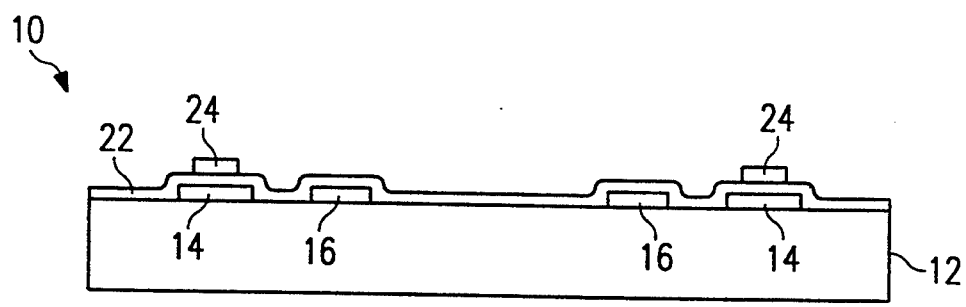

Next, a polymeric coating is formed on landing electrodes 14. To form the polymeric coating, one must form a polymer deposition layer 22 and a mask layer 24. FIG. 2B illustrates a polymer deposition layer 22 formed on top of semiconductor substrate 12, landing electrodes 14, and address electrodes 16. Mask layer 24 has been patterned and etched on top of polymer deposition layer 22. Alternatively, one could form other deposition layers on top of polymer deposition layer 22 and etch polymer deposition layer 22 along with these additional deposition layers if the device structure allowed this sequence.

Although many different types of polymers can be used to form polymer deposition layer 22, acceptable polymers include the family of polymers known as fluorocarbon polymers. This family is also known as fluoropolymers. These polymers tend to have low surface energy as indicated by their wetting characteristics. To use fluoro-polymers with existing semiconductor fabrication techniques, the polymers are normally applied in a liquid solution form. Such polymers may normally be applied either in polymer form or monomer form.

Acceptable monomers include fluoroalkyl-acrylates and fluoroakyl-methacrylates. One monomer solution that could be used is a solution of 1H, 1H perfluorooctylmethacrylate. Other monomers used to form fluoropolymers could also be used.

To form polymer deposition layer 22 using a monomer solution one applies the solution using wafer spinning at several hundred to several thousand revolutions per minute to achieve the desired precure thickness. To form a polymer coating from a monomer solution, one causes the monomers to cross-link to form a polymer. Ultraviolet sensitizers could be added to the monomer solution to aid in cross-linking. After the monomer solution has been spun on, exposure to ultraviolet light or to heat can be used to cause cross-linking of the monomers. An appropriate curing cycle may then be used to cause solvent evaporation and polymer adhesion.

Fluoro-polymers in solution form are less common. A product available from DuPont, however, contains a fluoro-polymer in solution form known as Teflon-AF, which stands for Teflon-amorphous fluoro-polymer. This solution consists of co-polymers of perfluoro (2, 2-dimethyl-1, 3-dioxole) and tetrafluoroethylene.

To form polymer deposition layer 22 using a polymer solution, one spins the solution onto the wafer between several hundred and several thousand revolutions per minute to achieve the desired precure thickness. After spinning on the polymer solution, appropriate curing cycles as are known in the art may be used to cause solvent evaporation and polymer adhesion. An example of a heating cycle to cure Teflon-AF is to heat the wafer with the spun on solution for 10 minutes at 50° C., followed by heating for 10 minutes at 10° C. above the solvent boiling point followed by 5 minutes at 245° C. followed by 15 minutes at 330° C. By using Teflon-AF, one eliminates the cross-linking processing step required when using a monomer solution.

After forming polymer deposition layer 22, one forms mask layer 24 using techniques known in the art. Mask layer 24 serves as the pattern for polymer deposition layer 22. Mask layer 24 consists of a layer of photoresist. A photoresist with low surface tension should normally be used to ensure that mask layer 24 properly adheres to polymer deposition layer 22. After polymer deposition layer 22 has been patterned using mask layer 24, the polymer deposition layer 22 may be etched.

Figure 2C:
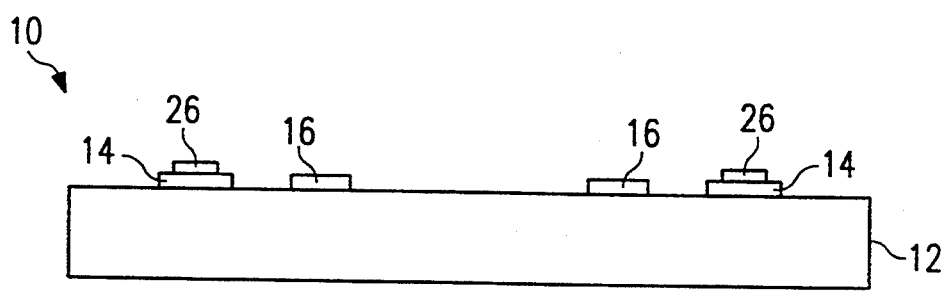

FIG. 2C illustrates protective layer 26 which remains after polymer deposition layer 22 and mask layer 24 have been etched. To etch the structure illustrated in FIG. 2B to form the structure illustrated in FIG. 2C, one first applies a parallel plate radio-frequency ash process to remove the exposed portions of polymer deposition layer 22. After this step, the only portion of polymer deposition layer 22 remaining is that portion that was unexposed because it was covered by mask layer 24. Mask layer 24 may then be removed using a remote plasma asher. Performing these two etching steps results in the structure illustrated in FIG. 2C whereby protective layer 26 is formed only in one or more desired regions.

Figure 2D:
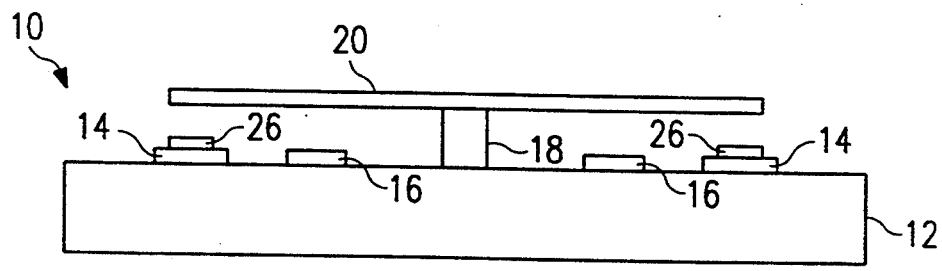

FIG. 2D illustrates a DMD 10 made in accordance with the present invention and having protective layer 26. Support posts 18 and deflectable beam 20 have been fabricated using known techniques. High etch selectivity between the support posts and the protective layer from 10:1 to 100:1, or higher should normally be used when etching support posts 18. Many different types of DMDs 10 may be constructed having protective layer 26. For example, the DMDs disclosed in U.S. Pat. No. 4,956,619, entitled "Spatial Light Modulator" U.S. Pat. No. 5,083,857, entitled "Multi-Level Deformable Mirror Device" U.S. Pat. No. 5,018,256, entitled "Architecture and Process for Integrating DMD with Control Circuit Substrates" and U.S. Pat. No. 5,061,049, entitled "Spatial Light Modulator and Method", all assigned to Texas Instruments Incorporated, could all be constructed in accordance with the teachings of the present invention.

Accordingly, the micromechanical device illustrated in FIG. 2 has many advantages. Protective layer 26 reduces the likelihood of deflectable beam 20 sticking to landing electrodes 14. In addition, protective layer 26 prevents substantial wear on landing electrodes 14 thus increasing the life of the device. Protective layer 26 is thermally stable above the temperatures normally required for military applications. For example, Teflon-AF is thermally stable at least above 150° C. The disclosed method allows protective layer 26 to be applied using standard semiconductor processing techniques thus allowing the placement and thickness of protective layer 26 to be easily controlled.

FIGS. 2A-D illustrate one method of forming a polymer coating on the surface of a micromechanical device. An alternative process is disclosed in FIGS. 3A-C.

Figure 3A:
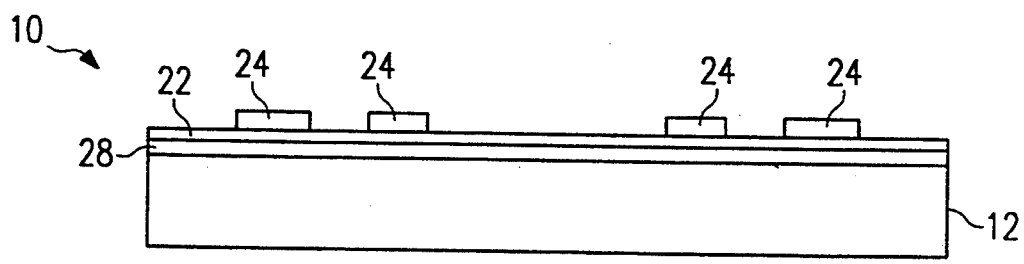
FIGS. 3a–3c illustrate an alternative method of fabricating a micromechanical device in accordance with the invention.

FIG. 3A illustrates semiconductor substrate 12 electrode deposition layer 28, polymer deposition layer 22 and mask layer 24. Address and control circuitry (not shown) has previously been formed on semiconductor substrate 12. Next, electrode deposition layer 28 has been formed on semiconductor substrate 12. Electrode deposition layer 28 will normally be a metal layer, but could conceivably be formed of some other material. After forming electrode deposition layer 28 using techniques known in the art, one forms polymer deposition layer 22 using the techniques discussed above. Again, one will normally use a fluoro-polymer for polymer deposition layer 22. For example, one can use Teflon-AF.

After electrode deposition layer 28 and polymer deposition layer 22 have been formed, one forms mask layer 24 which serves as a pattern for electrode deposition layer 28 and polymer deposition layer 22. One forms mask layer 24 using techniques known to those skilled in the art. As above, one may form mask layer 24 using a photoresist solution with a low surface tension to ensure proper adhesion of mask layer 24 to polymer deposition layer 22. After all of these layers have been formed, the structure may then be etched. Alternatively, one could form other deposition layers on top of polymer deposition layer 22 before forming mask layer 24 if the device structure allows such a processing sequence.

Figure 3B:
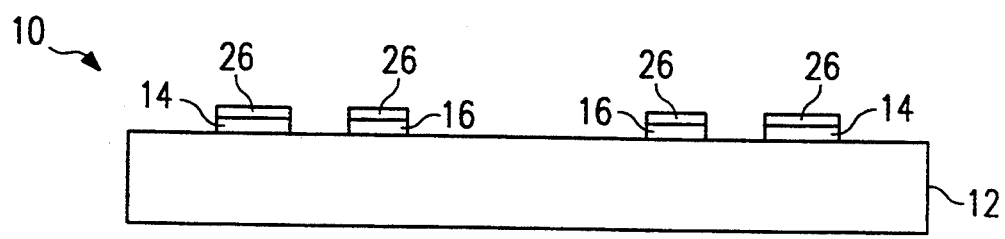

FIG. 3B illustrates the structure of FIG. 3A after etching. One first etches through polymer deposition layer 22 and electrode deposition layer 28 to remove any portion of these layers that is not protected from exposure by mask layer 24. Next, mask layer 24 may be etched leaving the structure illustrated in FIG. 3B.

Etching can be performed using techniques used in the art, such as described above. As illustrated in FIG. 3B, the resulting structure has a protective layer 26 on landing electrodes 14 and address electrode 16. Again, the method illustrated in FIG. 3 could be used to construct DMDs such as those disclosed in the above listed patents. This method could also be used in any other type of micromechanical device.

Figure 3C:
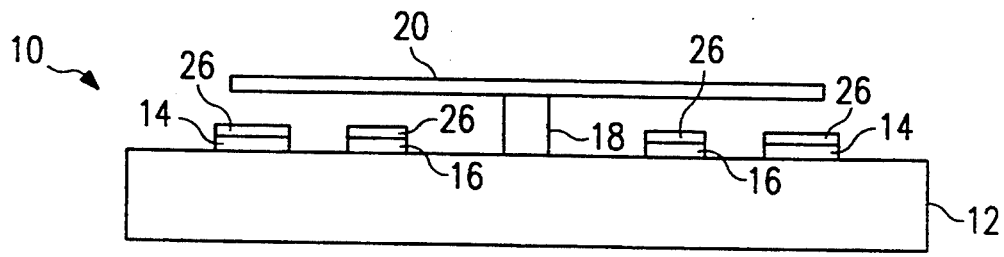

Finally, as illustrated in FIG. 3C, one forms support posts 18 and deflectable beam 20. DMD 10 illustrated in FIG. 3C has protective layer 26 on both the landing electrodes 14 and address electrode 16. Because fluoropolymers normally have a low dielectric constant, protective layer 26 is normally thin. Because deflectable beam 20 deflects due to electric fields created by applying a potential difference between address electrodes 16 and deflectable beam 20, a thick protective layer 26 would significantly increase the voltages required to cause deflection. Accordingly, protective layer 26 should be made thin to allow deflectable beam 20 to be easily deflected using address electrode 16.

Although the present invention and its advantages have been described in detail, it should be understood that various changes, substitutions and alterations can be made therein without departing from the spirit and scope of the invention as defined by the appended claims.

What is claimed is:

1. A method for reducing sticking of contacting elements of a micromechanical device comprising the step of:
   forming a protective layer on a first contacting element using a polymeric coating to form a coated element, thereby reducing the likelihood of said coated element sticking to another of said contacting elements and wherein said forming step occurs during the fabrication of said micromechanical device.

2. The method of claim 1 wherein said forming step further comprises the step of:
   forming said first contacting element prior to forming said protective layer on said first contacting element.

3. The method of claim 2 wherein said step of forming a protective layer further comprises the steps of:
   spinning on a fluoropolymer; and
   curing said fluoropolymer to form a polymer deposition layer.

4. The method of claim 2 wherein said step of forming a protective layer further comprises the steps of:
   spinning on a fluoropolymer;
   curing said fluoropolymer to form a polymer deposition layer; and
   patterning and etching said polymer deposition layer to form said protective layer only in one or more desired regions.

5. The method of claim 2 wherein said step of forming a protective layer further comprises the steps of:
   spinning on a copolymer of perfluoro (2,2-dimethyl-1,3-dioxole) and tetrafluoroethylene;
   curing said a copolymer of perfluoro (2,2-dimethyl-1,3-dioxole) and tetrafluoroethylene to form a polymer deposition layer.

6. The method of claim 2 wherein said step of forming a protective layer further comprises the steps of:
   spinning on a copolymer of perfluoro (2,2-dimethyl-1,3-dioxole) and tetrafluoroethylene;
   curing the a copolymer of perfluoro (2,2-dimethyl-1,3-dioxole) and tetrafluoroethylene to form a polymer deposition layer;
   patterning and etching said polymer deposition layer to form said protective layer only in one or more desired regions.

7. The method of claim 2 wherein said step of forming a protective layer further comprises the steps of:
   spinning on a fluoro-alkyl acrylate monomer solution;
   forming a polymer by causing cross-linking in said fluoro-alkyl acrylate monomer solution;
   curing the polymer to form a polymer deposition layer.

8. The method of claim 1 wherein said forming step further comprises the steps of:
   forming an element deposition layer;
   forming a fluoropolymer deposition layer on said element deposition layer; and
   patterning and etching said element deposition layer and said fluoropolymer deposition layer to form said first contacting element with said protective layer.

9. The method of claim 8 wherein said step of forming a fluoro-polymer deposition layer on said electrode metal deposition layer further comprises the steps of:
   spinning on a copolymer of perfluoro (2,2-dimethyl-1,3-dioxole) and tetrafluoroethylene;

curing the a copolymer of perfluoro (2,2-dimethyl-1,3-dioxole) and tetrafluoroethylene to form said fluoro-polymer deposition layer.

10. A method for reducing sticking in a deformable mirror device having an address electrode, a landing electrode, and a deflectable beam wherein a voltage applied between said deflectable beam and said address electrode causes said deflectable beam to deflect towards said landing electrode and contact said landing electrode, said method comprising the step of:

forming a protective layer on said landing electrode using a polymeric coating thereby reducing the likelihood of said deflectable beam sticking to said landing electrode and wherein said forming step occurs during the fabrication of said deformable mirror device.

11. The method of claim 1 wherein said forming step further comprises the steps of:

forming said address electrode and said landing electrode;

forming said protective layer on said landing electrode using a polymeric coating, wherein said protective layer is formed after said address and landing electrodes have been formed.

12. The method of claim 11 wherein said step of forming a protective layer further comprises the steps of:

spinning on a fluoropolymer;

curing said fluoropolymer to form a polymer deposition layer.

13. The method of claim 11 wherein said step of forming a protective layer further comprises the steps of:

spinning on a copolymer of perfluoro (2,2-dimethyl-1,3-dioxole) and tetrafluoroethylene;

curing said a copolymer of perfluoro (2,2-dimethyl-1,3-dioxole) and tetrafluoroethylene to form a polymer deposition layer; and patterning and etching said polymer deposition layer to form said protective layer only in one or more desired regions.

14. The method of claim 11 wherein said step of forming a protective layer further comprises the steps of:

spinning on a fluoro-alkyl acrylate monomer solution;

forming a polymer by causing cross-linking in said fluoro-alkyl acrylate monomer solution; and curing the polymer to form a polymer deposition layer.

15. The method of claim 10 wherein said step of forming a protective layer further comprises the steps of:

forming an electrode deposition layer;

forming a fluropolymer deposition layer on said electrode deposition layer;

patterning and etching said electrode deposition and said fluoropolymer deposition layers to form said address electrode and said landing electrode, said electrodes having said protective layer formed thereon.

16. A micromechanical device comprising:

a deflectable beam;

an address electrode adjacent said beam;

a landing electrode adjacent said beam wherein said landing electrode has been coated with a polymeric coating;

wherein a voltage applied between said beam and said address electrode deflects said beam toward said landing electrode and said landing electrode is located to contact said beam deflected toward said landing electrode and prevent said deflected beam from contacting said address electrode and wherein said beam touches said polymeric coating on said landing electrode when said beam is deflected toward said address electrode.

17. The micromechanical device of claim 16 wherein: said polymeric coating is a fluoro-polymer.

18. The micromechanical device of claim 16 wherein: said polymeric coating is a copolymer of perfluoro (2,2-dimethyl-1,3-dioxole) and tetrafluoroethylene.

19. The micromechanical device of claim 16 wherein: said polymeric coating consists of a cross-linked fluoroalkyl acrylate.

20. The micromechanical device of claim 16 wherein: said polymeric coating consists of a cross-linked fluoroalkyl methacrylate.

* * * * *